(12) United States Patent
Patil et al.

(10) Patent No.: US 9,118,325 B1
(45) Date of Patent: Aug. 25, 2015

(54) ROUTING NETWORK FOR PROGRAMMABLE LOGIC DEVICE

(71) Applicant: QuickLogic Corporation, Sunnyvale, CA (US)

(72) Inventors: Vishnu A. Patil, Bangalore (IN); Karyampoodi Bhanu Prasanth, Bangalore (IN); Wilma W. Shiao, San Jose, CA (US); Tarachand Pagarani, Bangalore (IN); Pinaki Chakrabarti, Bangalore (IN)

(73) Assignee: QuickLogic Corporation, Sunnyvale, CA (US)

( * ) Notice: Subject to any disclaimer, the term of this patent is extended or adjusted under 35 U.S.C. 154(b) by 0 days.

(21) Appl. No.: 14/476,518

(22) Filed: Sep. 3, 2014

Related U.S. Application Data

(60) Provisional application No. 62/042,720, filed on Aug. 27, 2014.

(51) Int. Cl.
*H03K 19/177* (2006.01)
*H03K 19/0175* (2006.01)

(52) U.S. Cl.
CPC .. *H03K 19/17736* (2013.01); *H03K 19/017581* (2013.01)

(58) Field of Classification Search
CPC .......... H03K 19/177; H03K 19/17736; H03K 19/17732; G06F 17/5054
USPC ...................................................... 326/38, 41
See application file for complete search history.

(56) References Cited

U.S. PATENT DOCUMENTS

| | | | |
|---|---|---|---|
| 5,818,254 A * | 10/1998 | Agrawal et al. | 326/39 |
| 6,531,890 B1 * | 3/2003 | Agrawal et al. | 326/41 |
| 6,538,470 B1 * | 3/2003 | Langhammer et al. | 326/41 |
| 7,028,281 B1 * | 4/2006 | Agrawal et al. | 326/41 |
| 7,375,552 B1 * | 5/2008 | Young et al. | 326/41 |
| 7,573,291 B1 | 8/2009 | Agrawal et al. | |
| 7,605,606 B1 * | 10/2009 | Ding et al. | 326/41 |
| 7,902,864 B1 | 3/2011 | Hutton et al. | |
| 7,924,052 B1 * | 4/2011 | Feng et al. | 326/41 |
| 2003/0128052 A1 * | 7/2003 | Cliff et al. | 326/41 |
| 2009/0289661 A1 * | 11/2009 | Lee et al. | 326/41 |

* cited by examiner

*Primary Examiner* — Don Le
(74) *Attorney, Agent, or Firm* — Silicon Valley Patent Group LLP

(57) ABSTRACT

A routing network is associated with a logic island in a logic block of a programmable logic device and includes switches for each of feedback, street, and highway and clock networks. Some of the switches include multiple stages. The feedback network switch receives signals from the logic island as well as from neighboring logic blocks and provides an output to one or more stages of the street network switch. The street network switch receives the signals from the feedback network switch and signals from neighboring highway network switches and provides an output to the logic island. A clock network switch may receive dedicated clock signals or high fan out signals as inputs and provides outputs to the street network switch. The highway network switch receives signals from the logic island and from neighboring highway network switches and provides an output to neighboring highway network switches.

74 Claims, 11 Drawing Sheets

ROUTING NETWORK FOR PROGRAMMABLE LOGIC DEVICE

CROSS REFERENCE TO RELATED APPLICATIONS

This application claims priority under 35 USC 119 to U.S. Provisional Application No. 62/042,720, filed Aug. 27, 2014, which is incorporated by reference herein in its entirety.

TECHNICAL FIELD

The present invention relates to programmable logic devices, and more specifically to routing networks used in programmable logic devices.

BACKGROUND

A programmable logic device, sometimes referred to as programmable application specific integrated circuit (PASIC), field programmable gate array (FPGA), or complex programmable logic device (CPLD), is a versatile integrated circuit chip, the internal circuitry of which may be configured by an individual user to realize a user-specific circuit. To configure a programmable logic device, the user configures an on-chip interconnect structure of the programmable logic device so that selected input terminals and selected output terminals of selected on-chip circuit components are electrically connected together in such a way that the resulting circuit is the specific circuit desired by the user.

Programmable logic devices include a number of programmable logic blocks that are interconnected by a programmable routing network, sometimes referred to as an interconnect network.

SUMMARY

A routing network is associated with a logic island in a logic block of a programmable logic device and includes switches for each of feedback, street, and highway and clock networks. Some of the switches include multiple stages. The feedback network switch receives signals from the logic island as well as from neighboring logic blocks and provides an output to one or more stages of the street network switch. The street network switch receives the signals from the feedback network switch and signals from neighboring highway network switches and provides an output to the logic island. A clock network switch may receive dedicated clock signals or high fan out signals as inputs and provides outputs to the street network switch. The highway network switch receives signals from the logic island through local routing wires and from neighboring highway network switches through the highway interconnect wires and provides an output to neighboring highway network switches.

In one implementation, a programmable logic device includes a plurality of logic blocks and an interconnecting network; wherein each logic block in the plurality of logic blocks comprises a logic island and a routing network associated with the logic island, wherein the routing network comprises: a first stage comprising a first plurality of switch boxes; and a second stage comprising a second plurality of switch boxes, wherein the first plurality of switch boxes of the first stage is interconnected with the second plurality of switch boxes of the second stage; wherein at least one switch box in the first stage has a first number of input terminals and a second number of output terminals, at least one of the output terminals has access to less than all of the input terminals.

In one implementation, a programmable logic device including a plurality of logic blocks and an interconnecting network; wherein each logic block in the plurality of logic blocks comprises a logic island and a routing network associated with the logic island, wherein the routing network comprises: a network switch comprising a first stage of switch boxes, a second stage of switch boxes, and a third stage of switch boxes, wherein a first portion of output terminals of the second stage of switch boxes is connected directly to the logic island, and a remaining portion of output terminals of the second stage of switch boxes is connected directly to input terminals of the third stage of switch boxes.

In one implementation, a programmable logic device includes a plurality of logic blocks and an interconnecting network; wherein each logic block in the plurality of logic blocks comprises a logic island and a routing network associated with the logic island, wherein the routing network comprises: a feedback network comprising a feedback network switch, the feedback network switch receiving a first set of output signals from the logic island and producing feedback output signals; and a street network comprising a street network switch, the street network switch comprising a first stage of switch boxes, a second stage of switch boxes connected to the first stage of switch boxes, and a third stage of switch boxes connected to the second stage of switch boxes, wherein at least one of the second stage of switch boxes and the third stage of switch boxes having input terminals that are coupled directly to the feedback network switch to receive the feedback output signals, the street network switch producing street output signals that are received by the logic island.

In one implementation, a programmable logic device includes a plurality of logic blocks and an interconnecting network; wherein each logic block in the plurality of logic blocks comprises a logic island and a routing network associated with the logic island, wherein the routing network comprises: a clock network switch having a plurality of output terminals that carry clock signals; and a street network comprising a street network switch, the street network switch comprising a first stage of switch boxes, a second stage of switch boxes connected to the first stage of switch boxes, and a third stage of switch boxes connected to the second stage of switch boxes, wherein at least a portion of the plurality of the output terminals of the clock network switch are coupled to provide the clock signals to at least one of the second stage of switch boxes and the third stage of switch boxes, the street network switch producing street output signals that are received by the logic island.

In one implementation, a programmable logic device including a plurality of logic blocks and an interconnecting network; wherein each logic block in the plurality of logic blocks comprises a logic island and a routing network associated with the logic island, wherein the routing network comprises: a feedback network comprising a feedback network switch, the feedback network switch comprising a first stage of switch boxes and a second stage of switch boxes, each switch box in the first stage of switch boxes has a plurality of input terminals, wherein a first subset of the plurality of input terminals is coupled to the logic island, and a second subset of the plurality of input terminals is coupled to neighboring logic islands that are in neighboring logic blocks immediately adjacent to the logic block, the feedback network producing feedback output signals; and a street network comprising a street network switch, the street network switch receiving the feedback output signals and producing street output signals that are received by the logic island.

In one implementation, a programmable logic device includes a plurality of logic blocks and an interconnecting network; wherein each logic block in the plurality of logic blocks comprises a logic island and a routing network associated with the logic island, wherein the routing network comprises: a feedback network comprising a feedback network switch, the feedback network switch receiving a first set of output signals from the logic island and receives GND and VCC, the feedback network switch producing feedback output signals including GND and VCC; and a street network comprising a street network switch, the street network switch receiving the feedback output signals including GND and VCC and producing street output signals that are received by the logic island.

DETAILED DESCRIPTION

Figure 1:
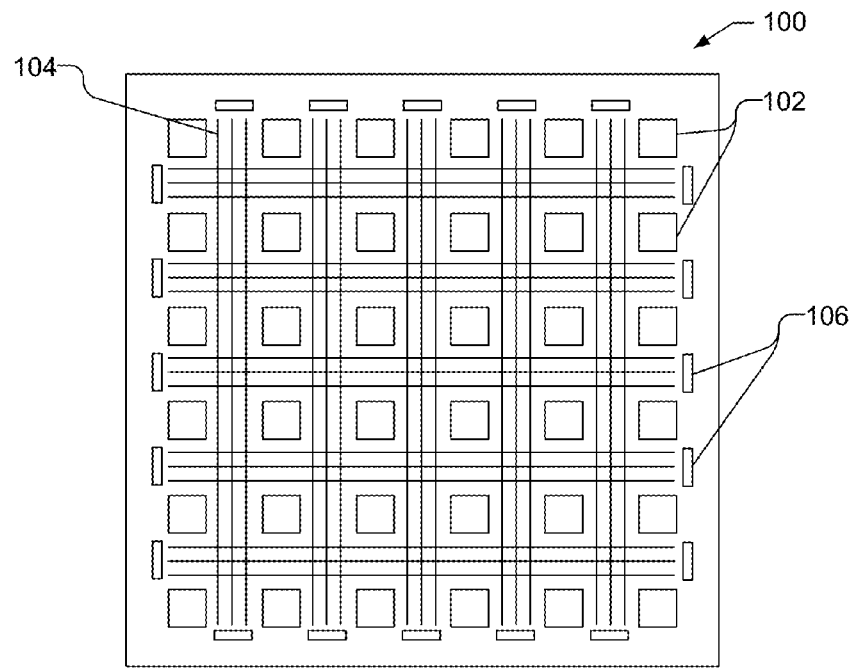
FIG. 1 shows a schematic view of an islanded programmable logic device.

FIG. 1 shows a schematic view of an islanded programmable logic device 100, such as a programmable application specific integrated circuit (PASIC), field programmable gate array (FPGA) or complex programmable logic device (CPLD) or similar devices. Programmable device 100 is illustrated with a number of rows and columns of logic blocks 102 with an interconnecting network 104, e.g., interconnecting wires, shown schematically as horizontal and vertical lines. Each logic block 102 includes one or more logic cells, sometimes referred to herein as logic islands, as well as associated network switches, which may include, e.g., one or more of a street network switch, a feedback network switch, a highway network switch, and a clock network switch, as discussed herein. Programmable device 100 may have more or fewer logic blocks 102 than is illustrated in FIG. 1. A number of input/output ("I/O") cells 106 are also shown in FIG. 1 connected to the interconnecting network 104. The network switches in each logic block 102 may include programmable elements, such as SRAM, EPROM, etc. that may be programmed to interconnect desired logic blocks 102 and I/O cells 106 in various configurations as desired by the user.

Figure 2:
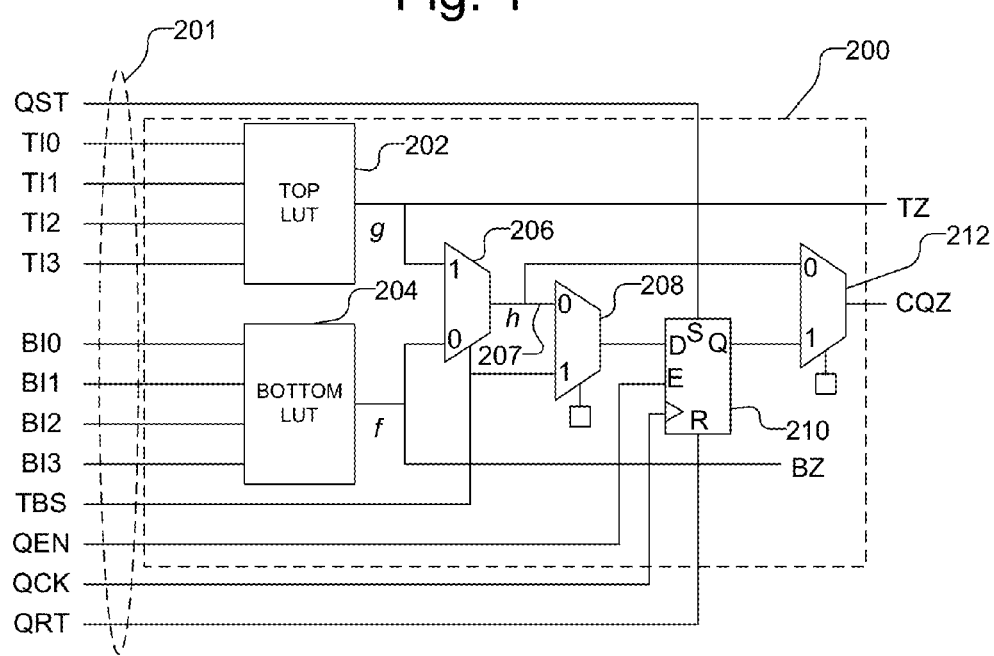
FIG. 2 illustrates an example of a logic cell which may serve as a logic island or as a component of a logic island in a logic block of a programmable logic device.

FIG. 2 illustrates an example of a logic cell 200 which may serve as a logic island within a logic block 102 in the programmable logic device 100, such as that illustrated in FIG. 1. The logic cell 200 is illustrated as including two four-input Look-Up Tables (LUTs) 202 and 204, as well as three two-input multiplexors 206, 208, and 212, and a register 210. The number of LUTs, the number of inputs to the LUTs, as well as the number of inputs to the multiplexors may be altered, if desired. Each LUT 202 and 204 has four input terminals coupled to the routing network 201 at inputs TI0, TI1, TI2, TI3 for top LUT 202 and BI0, BI1, BI2, BI3 for bottom LUT 204. The output terminal of the top LUT 202 may be provided as output TZ and the output terminal of the bottom LUT 204 may be produced as an output BZ.

The output terminals of the top LUT 202 and bottom LUT 204 are also coupled as inputs to 2×1 multiplexor 206. A select terminal of the multiplexor 206 is coupled to an input TBS. The multiplexor 206 produces a combinatorial logic signal on its output terminal 207. As illustrated, the input TBS is also coupled to an input terminal of the second 2×1 multiplexor 208 along with the output terminal 207 of multiplexor 206. The output terminal of the multiplexor 208 is coupled to the data D input of the register 210. The select terminal of the multiplexor 208 may be fixed, e.g., an SRAM-bit programmed at time of initiation of the programmable logic device to a tie high (VDD) signal or a tie low (GND) signal.

The register 210, illustrated as a D-type flip-flop, has a data D input terminal coupled to the output terminal of multiplexor 208, as well as a clock terminal driven by input QCK. The register 210 may further include a flip-flop enable input terminal E driven by input QEN, set signal input terminal driven by QST and reset signal input terminal driven by QRT. The register 210 includes an output terminal Q that is coupled to a first input terminal of the third 2×1 multiplexor 212. As can be seen, the output terminal 207 of first multiplexor 206 may also be coupled to an input terminal of the third multiplexor 212. The select terminal of the multiplexor 212, thus, selects between the output of the register 210 and the output of the combinatorial logic provided by LUTs 202 and 204 and multiplexor 206. The output terminal of multiplexor 212 may be provided as output CQZ. The select terminal of the multiplexor 212 may be fixed, e.g., an SRAM-bit programmed at time of initiation of the programmable logic device to a tie high (VDD) signal or a tie low (GND) signal.

Figure 3:
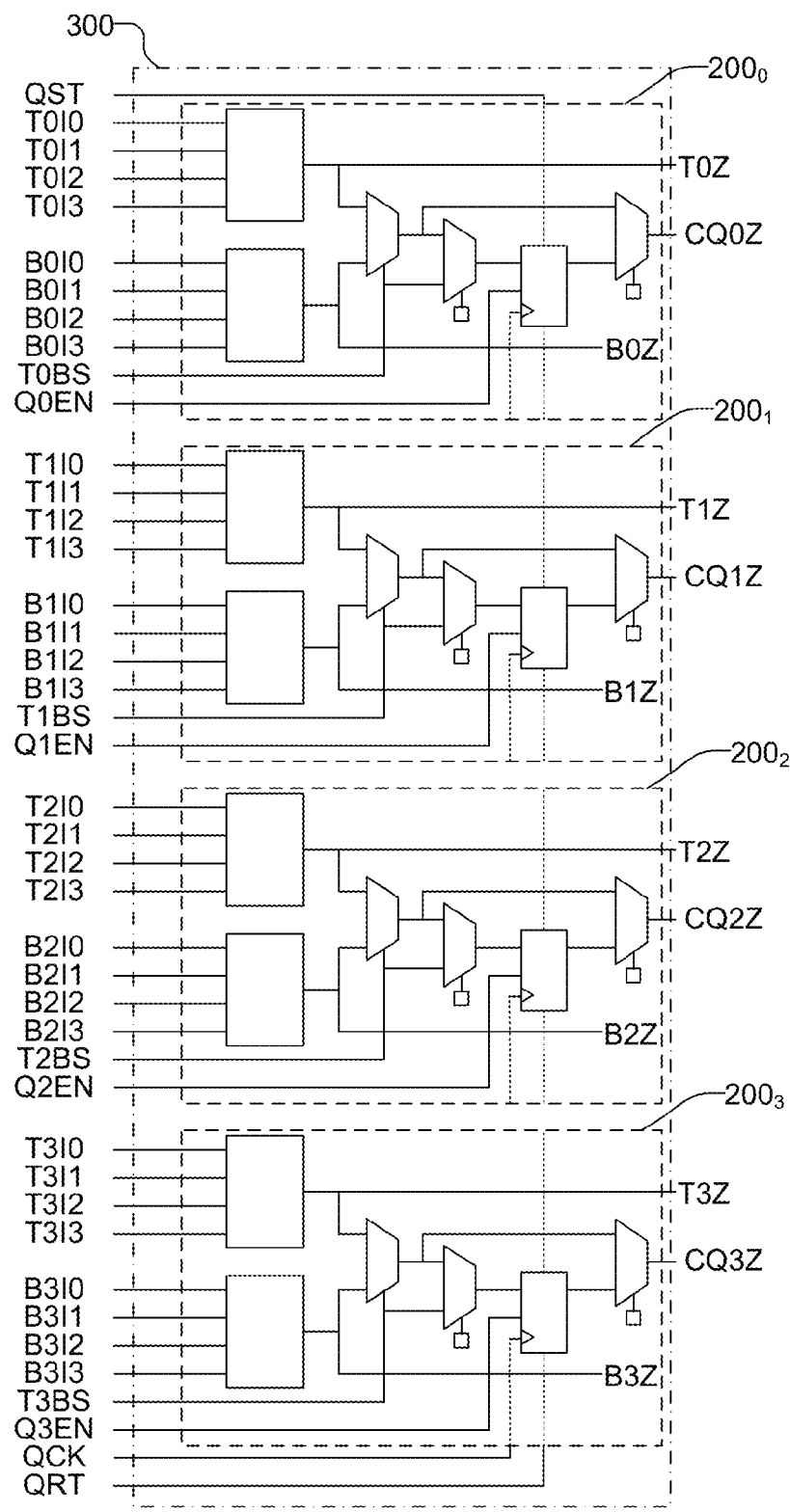
FIG. 3 illustrates a super logic cell, which is a cluster of logic elements, implemented with a plurality of logic cells shown in FIG. 2, which may serve as a logic island of a logic block in a programmable logic device.

FIG. 3 illustrates a super logic cell 300, which is a cluster of logic elements, implemented with a plurality of logic cells 200 illustrated in FIG. 2. Logic cell 200 and super logic cell 300 are described in U.S. Ser. No. 14/476,515, entitled "Logic Cell for Programmable Logic Device," by Vishnu A. Patil et al., filed concurrently herewith, which is incorporated herein by reference in its entirety. The super logic cell 300 may serve as the logic island within a logic block 102 in the programmable logic device 100 shown in FIG. 1. As illustrated, the super logic cell 300 includes four logic cells $200_0$, $200_1$, $200_2$, and $200_3$ (sometimes collectively referred to as logic cells 200). If desired, more or fewer logic cells may be contained within the super logic cell 300. All four logic cells 200 may share the same clock input QCK, reset input QRT and set input QST from the routing network for their respective registers, as illustrated with dotted lines within the logic cells. Each of the logic cells 200, however, may receive an independent flip-flop enable signals Q0EN, Q1EN, Q2EN, and Q3EN. From the super logic cell 300, eight outputs, namely T0Z, CQ0Z, T1Z, CQ1Z, T2Z, CQ2Z, T3Z and CQ3Z from logic cells $200_0$, $200_1$, $200_2$, and $200_3$, respectively, may be provided to other super logic cells through a routing network. The outputs B0Z, B1Z, B2Z and B3Z from logic cells $200_0$, $200_1$, $200_2$, and $200_3$, respectively, however, may not be provided to other super logic cells through the routing network, but may be used if and when required during logical path formation, to feed back to the same super logic cell 300, e.g., through a dedicated feedback network. If desired, the eight outputs, T0Z, CQ0Z, T1Z, CQ1Z, T2Z, CQ2Z, T3Z and CQ3Z from logic cells $200_0$, $200_1$, $200_2$, and $200_3$, respectively, may also be used as feed back to the same super logic cell 300, e.g., through the dedicated feedback network, not shown.

Figure 4:
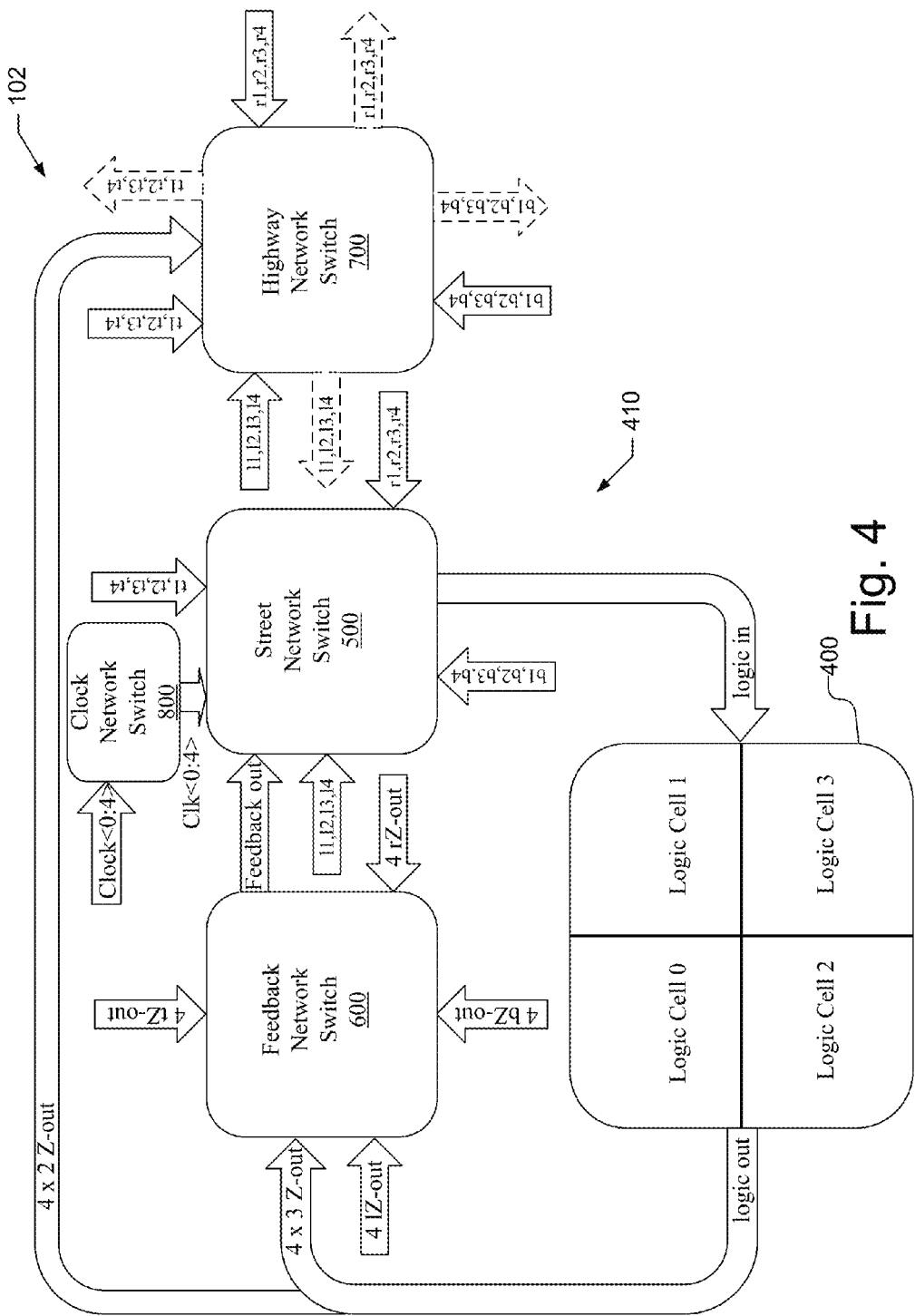
FIG. 4 is a block diagram illustrating a logic block with a logic island and associated routing network including a street network switch, a feedback network switch, a highway network switch, and a clock network switch.

FIG. 4 is a block diagram illustrating an embodiment of the logic block 102 in the programmable logic device 100 shown in FIG. 1. The logic block 102 is illustrated as including a logic island 400, which may include a plurality of logic cells, labeled logic cell 0, logic cell 1, logic cell 2, and logic cell 3, and may be implemented as the super logic cell 300 in FIG. 3. As will be understood by those of ordinary skill in the art in light of the present disclosure, the logic island 400 is not limited to the specific configuration illustrated in super logic cell 300 in FIG. 3 and may be implemented with other logic cell configurations including additional or fewer logic cells. The logic block 102 is further illustrated as including a routing network 410 that may include, e.g., one or more network switches selected from a group including a street network switch 500, a feedback network switch 600, a highway network switch 700, and a clock network switch 800, and the accompanying routing resources, e.g., wires and programmable elements, such as SRAMs, EPROMs, etc., that may be programmed to interconnect desired logic blocks 102 and I/O cells 106 in various configurations as desired by the user. As the logic island 400 and the street network switch 500, feedback network switch 600, highway network switch 700, and clock network switch 800 are within the same logic block 102, the various network switches 500, 600, 700, and 800 are sometimes referred to as being associated with the logic island 400 and vice versa. The programmable logic device 100 shown in FIG. 1 may be implemented with an array of logic blocks 102, including logic island 400 and associated routing network 410, such that each logic block 102 has at least four neighboring logic blocks to the top (t), bottom (b), left (l) and right (r). The logic block 102 may be said to further include neighboring logic blocks along the diagonals directions, e.g., at the left-top (lt), the left-bottom (lb), the right-top (rt), and right bottom (rb). Of course, if the logic block 102 is located at a side or corner of the programmable logic device 100, there are fewer neighboring logic blocks. It should be understood that the routing network 410 (including one or more of the street network switch 500, feedback network switch 600, highway network switch 700 and clock network switch 800) is associated with the logic island 400 in the logic block 102, and thus, neighboring logic blocks or components of neighboring logic blocks may be referenced to the routing network 410 (or the included one or more of the street network switch 500, feedback network switch 600, highway network switch 700 and clock network switch 800) or the associated logic island 400 interchangeably.

As illustrated in FIG. 4, the logic island 400 receives input data (logic in) from the street network switch 500 and produces output data (logic out) to the feedback network switch 600 and the highway network switch 700. The output data (logic out) may be, e.g., the TZ, BZ and CQZ outputs from each logic cell of a super logic cell, as illustrated in FIGS. 2 and 3, and is sometimes collectively referred to as Z-out. The feedback network switch 600 may receive at least a portion of the output data (logic out) from the logic island 400. For example, as illustrated in FIG. 4, the feedback network switch 600 may receive 4×3 Z-out signals from the logic island 400, as it may receive any of the three outputs TZ, BZ, and CQZ from each of the four logic cells (e.g., logic cells 200 shown in FIG. 2) of the logic island 400. Additionally, the feedback network switch 600 may receive at least a portion of the Z-out signals from logic islands in immediately neighboring logic blocks, e.g., to the immediate left (l), right (r), top (t) and bottom (b) of the logic block 102. By way of example, the feedback network switch 600 may receive Z-out signals from the four logic cells in a logic island to the immediate left (4 lZ-out), Z-out signals from the four logic cells in a logic island to the immediate right (4 rZ-out), Z-out signals from the four logic cells in a logic island to the immediate top (4 tZ-out), and Z-out signals from the four logic cells in a logic island to the immediate bottom (4 bZ-out). The Z-out signals received from logic islands in immediately neighboring logic blocks may be, e.g., the CQZ outputs and/or the TZ outputs from the neighboring logic islands. The feedback network switch 600 provides its output (feedback out) to the street network switch 500.

Figure 4A:
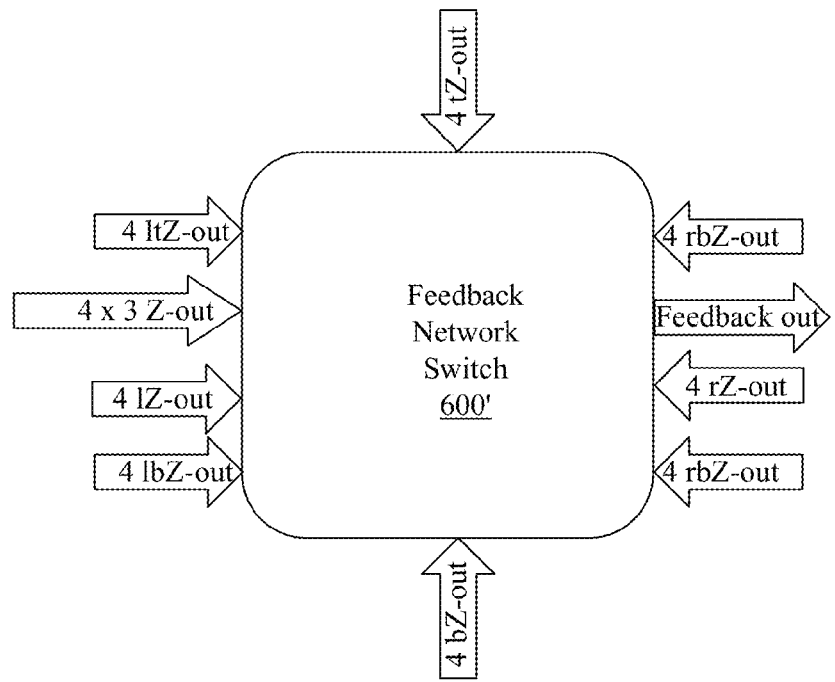
FIG. 4A illustrates an embodiment of the feedback network switch from FIG. 4.

Moreover, the feedback network switch 600 may receive Z-out signals from additional neighboring logic islands, e.g., four additional logic islands in logic blocks located diagonally with respect to the logic block 102. Thus, feedback network switch 600 may receive Z-out signals from a total of eight neighboring logic blocks. For example, FIG. 4A illustrates a feedback network switch 600' that is similar to and may be used in place of feedback network switch 600 shown in FIG. 4, and that receives Z-out signals from eight neighboring logic blocks, including additional Z-out signals from four logic cells in a logic island to the immediate left-top (4 ltZ-out), Z-out signals from the four logic cells in a logic island to the immediate right-top (4 rtZ-out), Z-out signals from the four logic cells in a logic island to the immediate left-bottom (4 lbZ-out), and Z-out signals from the four logic cells in a logic island to the immediate right-bottom (4 rbZ-out).

The street network switch 500 receives the output signals (feedback out) from the feedback network switch 600. The street network switch 500 may also receive clock signals from the clock network switch 800. The street network switch 500 also receives signals from a plurality of neighboring highway network switches, i.e., highway network switches in a plurality (i) of neighboring logic blocks in each direction, e.g., to the left (l), right (r), top (t) and bottom (b) with respect to the street network switch 500. For example, in one implementation, i=4, and thus, the street network switch 500 may receive signals from four neighboring highway network switches to the left li (i=1, 2, 3, 4), right ri (i=1, 2, 3, 4), top ti (i=1, 2, 3, 4), and bottom bi (i=1, 2, 3, 4). Thus, as illustrated in FIG. 4, the street network switch 500 may receive signals from the highway network switches associated with four neighboring logic blocks to the left (l1, l2, l3, l4), the highway network switches associated with four neighboring logic blocks to the right (r1, r2, r3, r4), the highway network switches associated with four neighboring logic blocks to the top (t1, t2, t3, t4), and the highway network switches associated with four neighboring logic blocks to the bottom (b1, b2, b3, b4). The street network switch 500 may output at least a portion of the received signals, including the data from the feedback network switch 600, the data from the highway network switches associated with neighboring logic blocks, and the clock signals from the clock network switch 800, to the associated logic island 400 as input data (logic in).

Figure 4B:
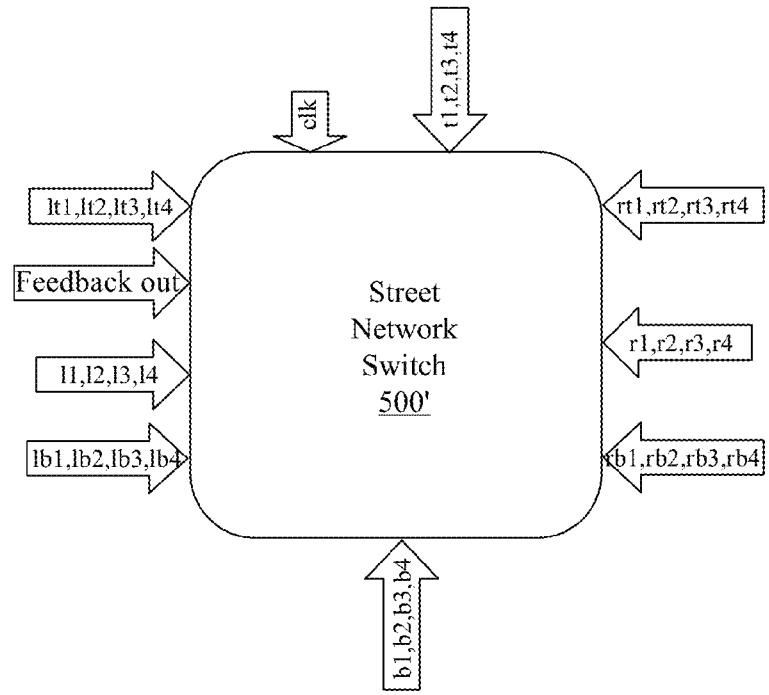
FIG. 4B illustrates an embodiment of the street network switch from FIG. 4.

Moreover, the street network switch 500 may additionally receive signals from a plurality of neighboring highway network switches in the diagonal directions with respect to logic block 102. For example, FIG. 4B illustrates a street network switch 500' that is similar to and may be used in place of street network switch 500 shown in FIG. 4 and receives signals from a plurality j of highway network switches in eight directions, including the left (l), right (r), top (t) and bottom (b), as well as the left-top (lt), right-top (rt), left-bottom (lb) and right-bottom (rb), where j may be the same or different than i. Thus, where j=4, street network switch 500' may receive additional signals from, e.g., the highway network switches associated with four neighboring logic blocks to the left-top (lt1, lt2, lt3, lt4), the highway network switches associated with four neighboring logic blocks to the right-top (rt1, rt2, rt3, rt4), the highway network switches associated with four neighboring logic blocks to the left-bottom (lb1, lb2, lb3, lb4), and the highway network switches associated with four neighboring logic blocks to the right-bottom (rb1, rb2, rb3, rb4).

The highway network switch 700 may also receive at least a portion of the output data (logic out) from the logic island 400. For example, as illustrated, the highway network switch 700 may receive 4×2 Z-out, as it may receive any of the two outputs TZ and CQZ from each of the four logic cells of the logic island 400 through local routing wires. Additionally, the highway network switch 700 may also receive signals from a plurality of neighboring highway network switches, i.e., highway network switches in a plurality (i) of neighboring logic blocks in each direction, e.g., to the left (l), right (r), top (t) and bottom (b) with respect to the highway network switch 700 through the highway interconnect wires, e.g., interconnecting network 104 in FIG. 1. For example, in one implementation, i=4, and thus, the highway network switch 700 may receive signals from four neighboring highway network switches to the left li (i=1, 2, 3, 4), right ri (i=1, 2, 3, 4), top ti (i=1, 2, 3, 4), and bottom bi (i=1, 2, 3, 4). Thus, as illustrated in FIG. 4, the highway network switch 700 may receive signals from the highway network switches associated with four neighboring logic blocks to the left (l1, l2, l3, l4), the highway network switches associated with four neighboring logic blocks to the right (r1, r2, r3, r4), the highway network switches associated with four neighboring logic blocks to the top (t1, t2, t3, t4), and the highway network switches associated with four neighboring logic blocks to the bottom (b1, b2, b3, b4). The highway network switch 700 may provide the received signals, including the data from the logic island 400 and the data from neighboring highway network switches as output signals to street network switches and highway network switches in neighboring logic blocks in each direction via highway interconnect wires, e.g., i neighboring logic blocks to the left (l), right (r), top (t) and bottom (b) with respect to the highway network switch 700, where in one implementation i=4. Thus, as illustrated by the arrows with dashed lines pointing away from highway network switch 700, output data is provided to the street network switches and highway network switches in four neighboring logic blocks to the left (l1, l2, l3, l4), in four neighboring logic blocks to the right (r1, r2, r3, r4), in four neighboring logic blocks to the top (t1, t2, t3, t4), and in four neighboring logic blocks to the bottom (b1, b2, b3, b4).

Figure 4C:
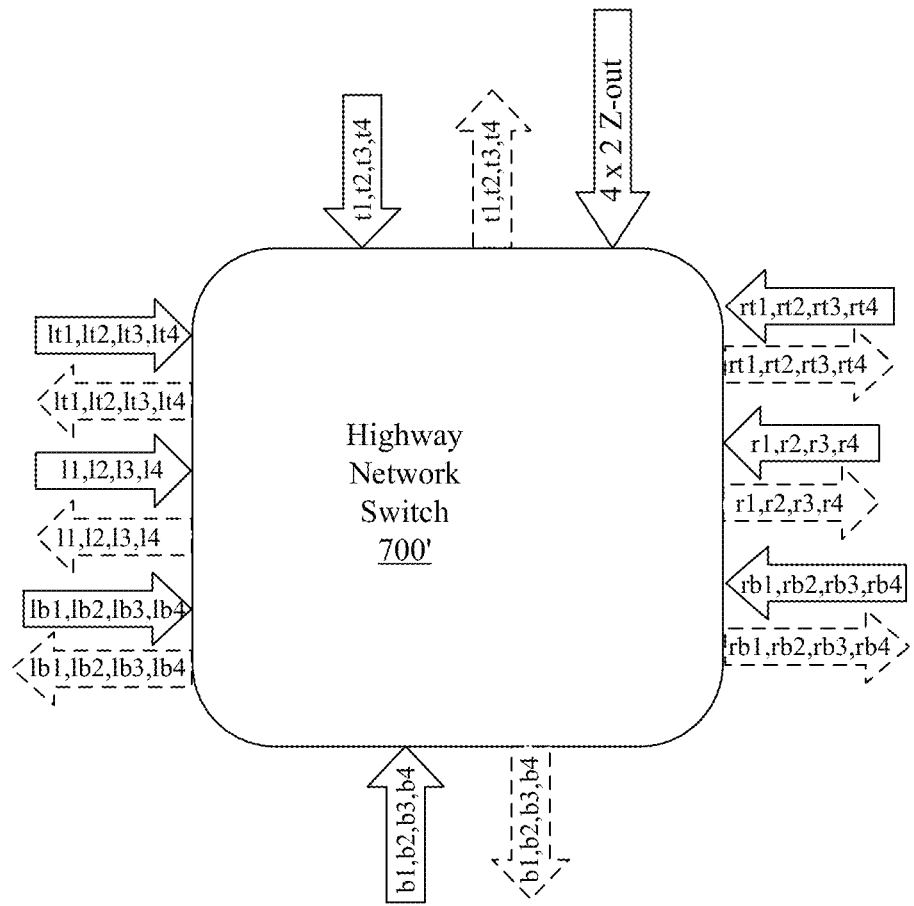
FIG. 4C illustrates an embodiment of the highway network switch from FIG. 4.

Moreover, the highway network switch 700 may additionally receive signals from and output signals to a plurality of neighboring highway network switches in the diagonal directions with respect to logic block 102. For example, FIG. 4C illustrates a highway network switch 700' that is similar to and may be used in place of highway network switch 700 and that receives signals from and outputs signals to a plurality j of highway network switches in eight directions, including the left (l), right (r), top (t) and bottom (b), as well as the left-top (lt), right-top (rt), left-bottom (lb) and right-bottom (rb), where j may be the same or different than i. Thus, where j=4, highway network switch 700' receives additional signals from and provides signals to (as illustrated with solid arrows and arrows with dashed lines) the highway network switches associated with four neighboring logic blocks to the left-top (lt1, lt2, lt3, lt4), the highway network switches associated with four neighboring logic blocks to the right-top (rt1, rt2, rt3, rt4), the highway network switches associated with four neighboring logic blocks to the left-bottom (lb1, lb2, lb3, lb4), and the highway network switches associated with four neighboring logic blocks to the right-bottom (rb1, rb2, rb3, rb4).

The clock network switch 800 illustrated in FIG. 4 may receive dedicated clock signals or high fan out signals Clock <0:4> as inputs and provides outputs (clk<0:4>) to the street network switch 500.

Figure 5:
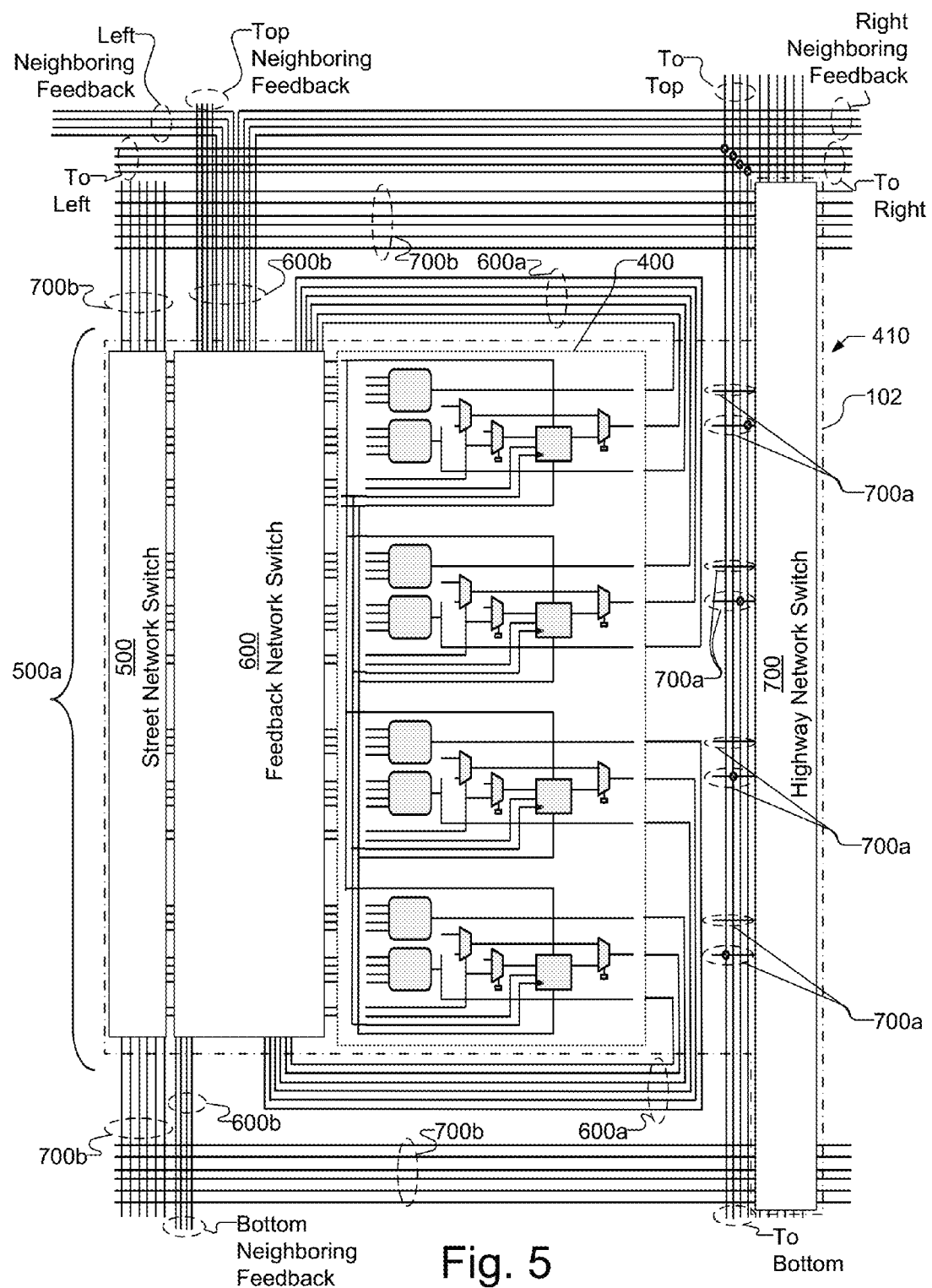
FIG. 5 illustrates a logic block with a logic island and associated routing network.

FIG. 5, by way of example, illustrates a logic block 102 including a logic island 400 (implemented as the super logic cell 300 from FIG. 3) and the routing network 410, including the street network switch 500, the feedback network switch 600, and the highway network switch 700, as well routing resources including wires and programmable elements. It should be understood that only a portion of the routing resources are illustrated in FIG. 5 in order to avoid unduly complicating the figure, but one of ordinary skill in the art may implement the routing recourses to the various network switches and associated logic island in the logic block 102 and to other logic blocks in light of the present disclosure. FIG. 5 illustrates street network resources 500a coupled to the street network switch 500, feedback network resources 600a and 600b coupled to the feedback network switch 600, where feedback network resources 600a are routing wires from the associated logic island outputs and feedback network resources 600b are routing wires from neighboring logic blocks, and highway network resources 700a and 700b coupled to the highway network switch 700, wherein highway network resources 700a are routing wires coupled to the associated logic island outputs, and highway network resources 700b are routing wires from neighboring logic blocks. As illustrated logic island 400 provides output signals to the feedback network resources 600a and the highway network resources 700a, and the street network resources 500a provide inputs to the associated logic island 400. Additionally, it can be seen that the feedback network resources 600b and highway networks resources 700b receive signals from the left, right, top and bottom logic blocks. The feedback network resources 600b and highway networks resources 700b from neighboring logic blocks to the left, right, top and bottom are coupled to the street network resources 500a.

Figure 6:
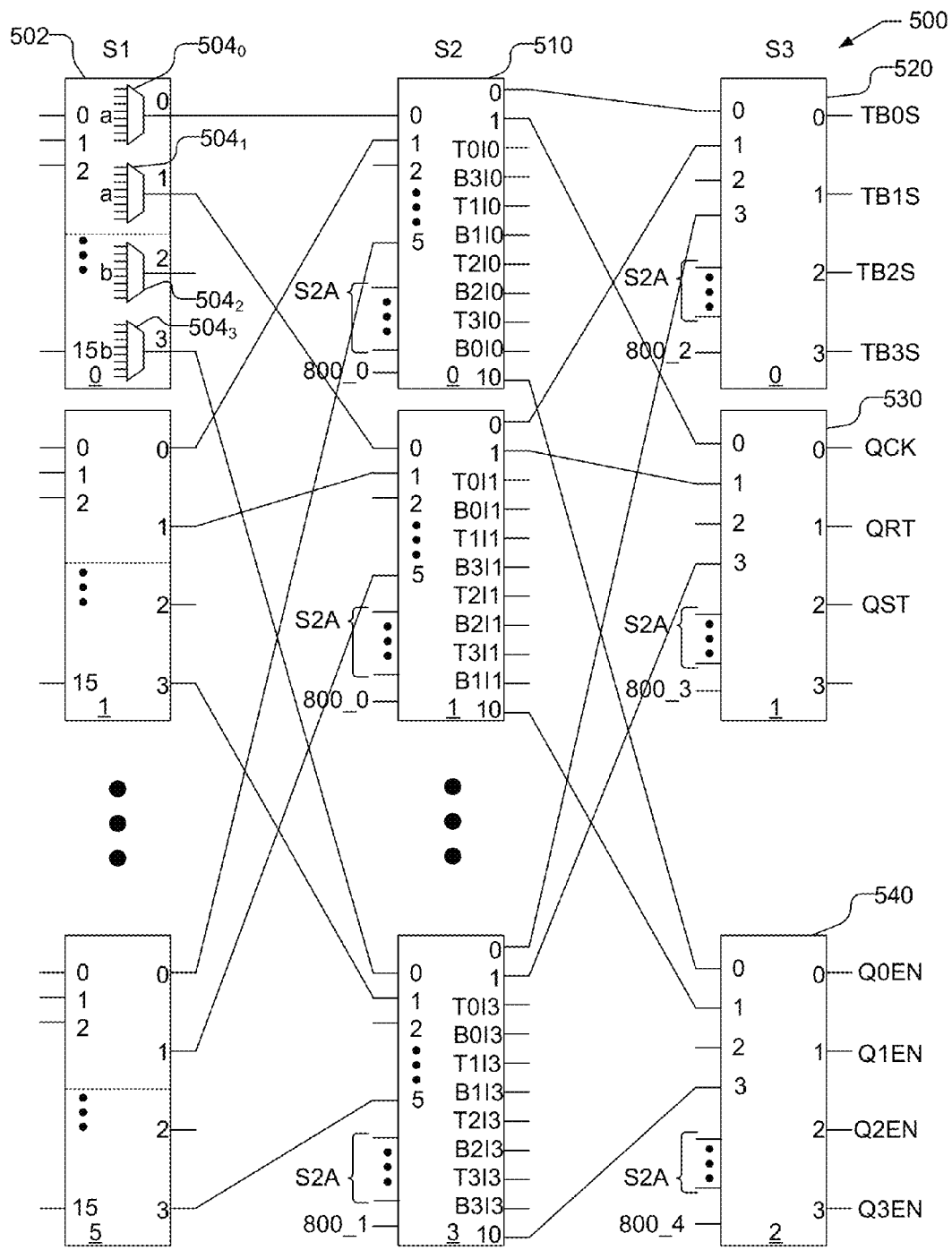
FIG. 6 illustrates the architecture of the street network switch.
Figure 7:
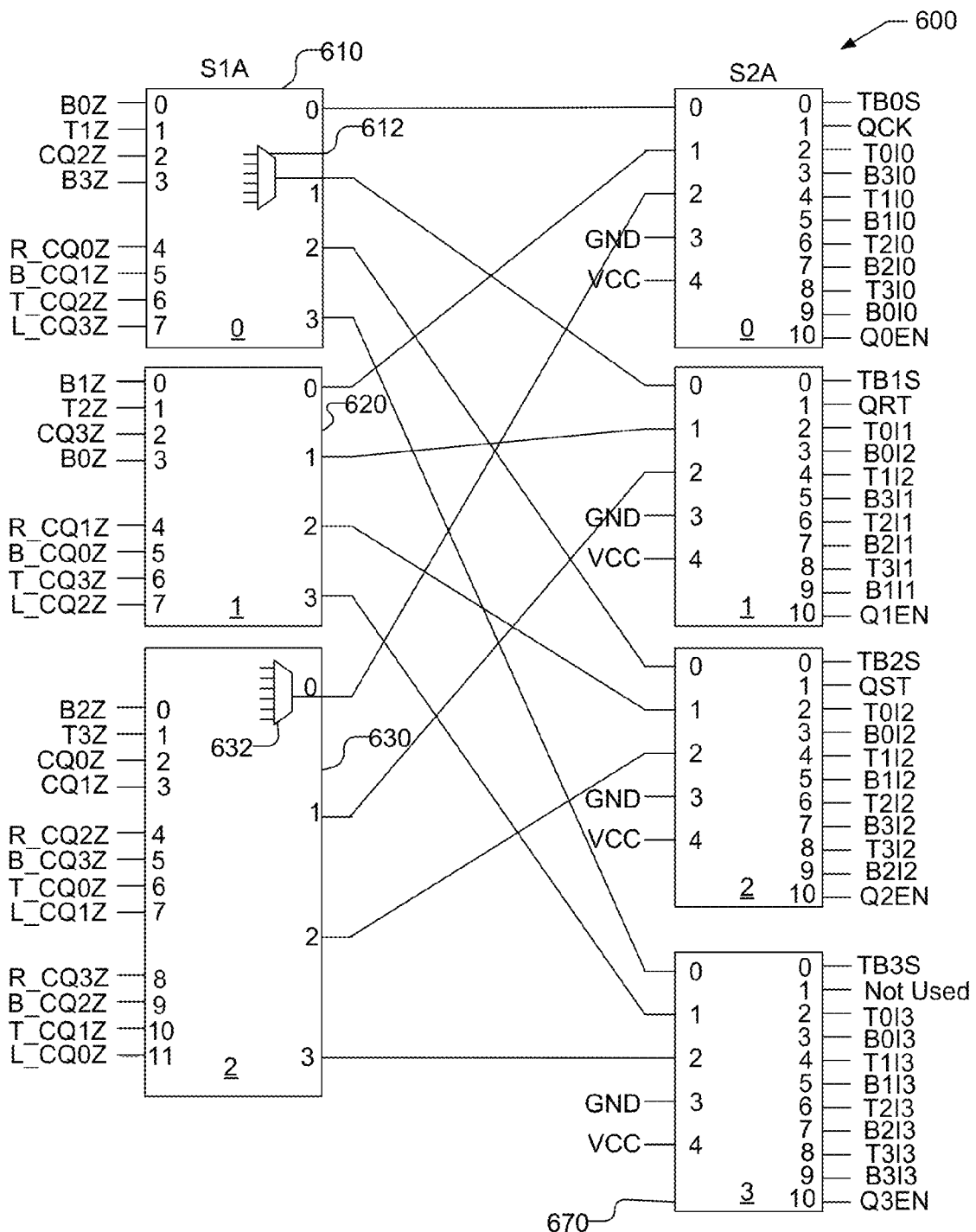
FIG. 7 illustrates the architecture of the feedback network switch.

FIG. 6 illustrates the architecture of the street network switch 500 and FIG. 7 illustrates the architecture of the feedback network switch 600. The street network switch 500 and the feedback network switch 600 are hybrid switching networks with different numbers of stages of switchboxes for different types of signals. As can be seen in FIGS. 6 and 7, the street network switch 500 and feedback network switch 600 include multiple stages including S1, S2, and S3 in the street network switch 500, and stages S1A and S2A in the feedback network switch 600.

The street network switch 500 is a Probabilistic Multistage Circuit Switching Network (PMCSN), which structurally differs from a conventional multi-stage non-blocking communication network topologies, such as a Clos network, as the street network switch 500 ensures just enough number of cross-points to meet a probabilistic goal in terms of possible number of paths through the stages for the class of circuits at interest. In a staged network system with a traditional multi-stage non-blocking communication network topologies, an input signal can reach an output without blocking any other signals. Thus, the reaching probability of any input signal to the output is 1. In PMCSN, on the other hand, while there are provisions for realizing any input at the outputs, there may be situations of simultaneous output demands of multiple input signals, and thus, blocking of one or more input signals is unavoidable in order to pass another input signal. The design of PMCSN emphasizes the non-blocking of signals that are determined to be higher in demand while signals that are lower in demand may be blocked. Consequently, probabilistically high demand signals will most likely be unblocked in PMCSN, which is why the street network switch 500 is probabilistic in nature.

As illustrated in FIG. 6, each stage of the street network switch 500 may contain a plurality of switch boxes. For example, stage S1 may contain six switch boxes, labeled 0-5, wherein each switch box in stage S1 may have 16 input terminals (labeled 0-15) and 4 output terminals (labeled 0-3). Stage S1 may receive input signals from the highway network switches associated with a plurality of neighboring logic blocks to the left, right, top and bottom of the street network switch 500. For example, stage S1 may receive signals from four highway network switches in each direction. Each of the highway network switches may provide, e.g., six signals in each direction. Thus, stage S1 may receive 24 input signals from each direction, thus resulting in 96 input signals to stage S1 of the street network switch 500. Of course, if desired, a different number of signals from each highway network switches, as well as a different number of highway network switches in each direction, may be used.

At least one switch box in stage S1 of the street network switch 500 includes at least one output terminal that does not have full access to all of the input terminals in that switch box. For example, as illustrated with dotted lines in the switch boxes in stage S1, the output terminals of each switch box do not have full access to all of the input terminals in each switch box. In other words, in each switch box 0-5 in stage S1, each output terminal 0-3 has access to less than all of the input terminals 0-15. By way of example, as illustrated in switch box 502, each output terminal 0-3 is connected to a proper subset of the input terminals 0-15 with a multiplexor $504_0$, $504_1$, $504_2$, and $504_3$. If desired, one half of the input terminals may be accessible to each output terminal, as can be seen in switch box 502, which has 16 input terminals and an 8×1 multiplexors 504a, 504b, 504c, and 504d connected to each output terminal. If desired, other sizes of proper subsets of the input terminals may be used. Additionally, output terminals 0 and 1 may have access to a subset a that is half of any of the input terminals 0-15, while output terminals 2 and 3 may have access to a subset b of input terminals 0-15 that is a complement of subset a, i.e., none of input terminals in subset a are in subset b. If desired, each output terminal 0-3 in each switch box in stage S1 may have access to a different subset of input terminals 0-15. The specific input terminal that may be accessed by each output terminal may be programmed at time of initiation of the programmable logic device.

The second stage S2 in the street network switch 500 also contains a plurality of switch boxes. By way of example, stage S2 is illustrated as contains 4 switch boxes (labeled 0-3), each having 6 input terminals (labeled 0-5) that are connected to the output terminals from switch boxes 0-5 in stage S1. As illustrated in FIG. 6, feedback output signals, e.g., from stage S2A in the feedback network switch 600, shown in FIG. 7, may be received by at least one of the second stage S2 and the third stage S3 of the street network switch 500. For example, the switch boxes 0-3 in stage S2 each additionally includes input terminals that are connected to a portion of the output terminals from stage S2A in the feedback network switch 600, shown in FIG. 7. As illustrated in FIG. 6, clock signals may be provided to the associated logic island 400 through at least one of the second stage S2 and the third stage S3. For example, the switch boxes 0-3 in stage S2 may each additionally includes input terminals that are connected to a portion of the output terminals from the clock network switch 800, shown in FIG. 10. As illustrated in FIG. 6, switch box 510 includes an input terminal that receives input from output terminal 0 of the clock network switch 800, designated as 800_0, as does switch box 1 in stage S2. Switch boxes 2 (not shown) and 3 in stage S2 both receive input from output terminal 1 of the clock network switch 800, designated as 800_1. Each switch box 0-3 in stage S2 may include, e.g., 11 output terminals. A portion of the output terminals of each switch box 0-3 in stage S2, e.g., output terminals 0, 1, and 10, is connected directly to the input terminals of the switch boxes in the third stage S3. The remaining portion of output terminals of each switch box 0-3 in stage S2 is connected directly to the logic island 400. For example, switch box 510 in stage S2 is illustrated as including 8 output terminal labeled T0I0, B3I0, T1I0, B1I0, T2I0, B2I0, T3I0, and B0I0, which may be connected directly to the logic island 400. By way of example, the output terminals from each switch box in second stage S2 that are connected directly to the logic island 400 may be connected to the input terminals of the LUTs in each logic cell in the logic island 400, e.g., as illustrated with matching terminal labels in FIG. 6 and FIG. 3.

Figure 8:
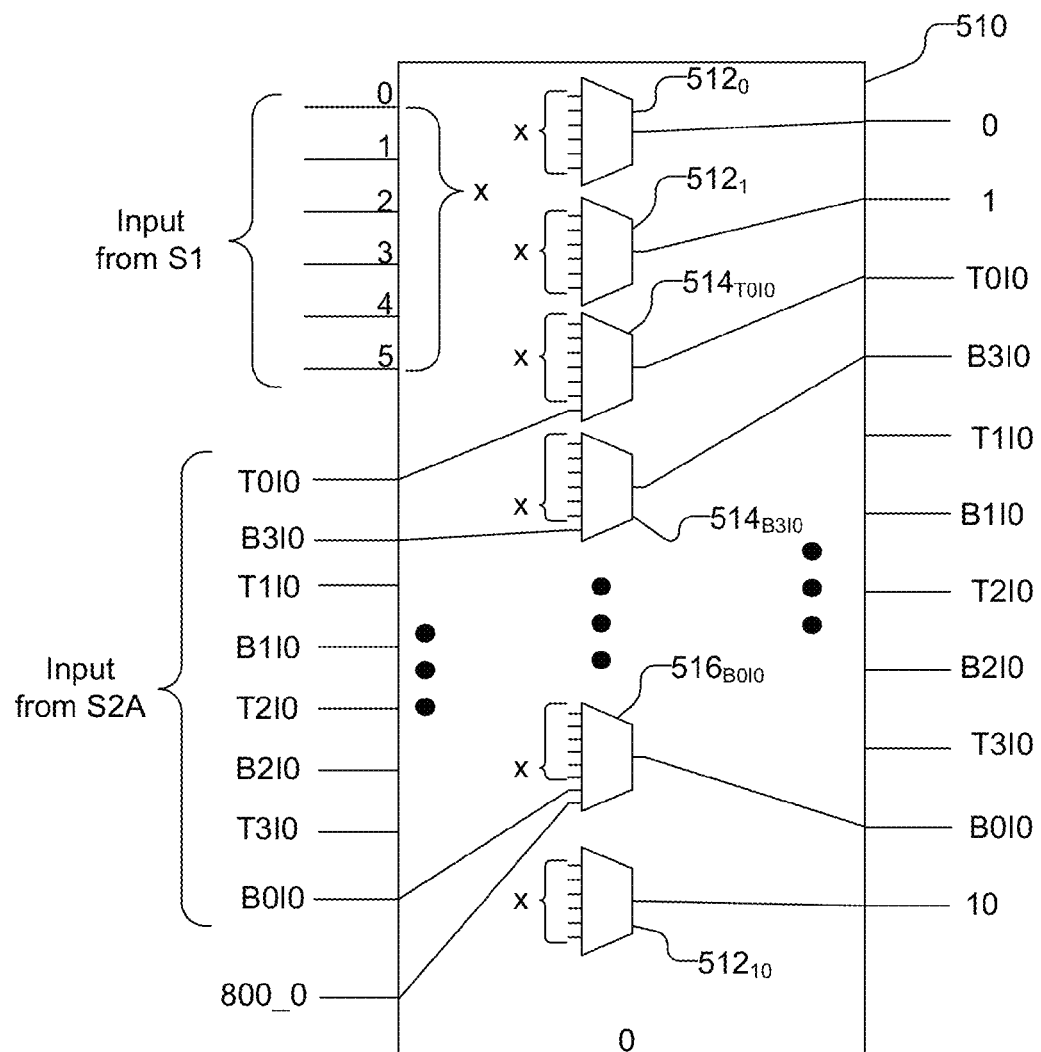
FIG. 8 illustrates a switch box from the second stage of the street network switch.

FIG. 8, by way of example, illustrates switch box 510 from stage S2. The remaining switch boxes in stage S2 may be similarly configured as illustrated by switch box 510. As illustrated in FIG. 8 switch box 510 receives input from S1 via 6 input terminals (labeled 0-5), collectively designated with an "x". Additionally, switch box 510 may also receive input from S2A at 8 input terminals, labeled T0I0, B3I0, T1I0, B1I0, T2I0, B2I0, T3I0, and B0I0, which are connected to a portion of the output terminals of the second stage of the feedback network switch S2A with corresponding terminal labels, shown in FIG. 7. The switch box 510 may further receive input from the clock network switch 800 from output terminal 0 of the clock network switch 800, designated as 800_0. The switch box 510 includes output terminals 0, 1, and 10, which are connected directly to the input terminals of the switch boxes in the third stage S3 for the street network switch 500, as illustrated in FIG. 6. As can be seen in FIG. 8, each output terminal 0, 1, and 10 has access to all of the input terminals 0-5, as illustrated by 6×1 multiplexors $512_1$, $512_2$, $512_{10}$, with input terminals labeled with an "x." Each of remaining portion of the output terminals of switch box 510 also has access to all of the input terminals 0-5, as well as at least one of the input terminals that receives input from S2A that is connected to the feedback network switch, i.e., Input from S2A. Additionally, one or more of the output terminals, e.g., output terminal B0I0, may have access to the clock signal from input terminal 800_0. Thus, for example, output terminal T0I0 has access to all of the input terminals 0-5, as well as input terminal with the same label T0I0, as illustrated by 7×1 multiplexor $514_{T0I0}$. Similarly, output terminals B3I0 and B0I0 have access to all of the input terminals 0-5, as well as input terminal with the same respective labels B3I0 and B0I0, as illustrated by 7×1 multiplexor $514_{B3I0}$ and 8×1 multiplexor $516_{B0I0}$. The remaining output terminals may have similar access to the input terminals via 7×1 multiplexors, where output terminal B010 additionally has access to the clock signal from input terminal 800_0 and thus uses an 8×1 multiplexor $516_{B0I0}$. It should be understood that while 6×1, 7×1, and 8×1 multiplexors are illustrated in switch box 510, other equivalent circuits may be used, for example, a 7×1 multiplexor may be replaced with a 6×1 multiplexor and a 2×1 multiplexor.

Referring back to FIG. 6, the third stage S3 in the street network switch 500 also contains a plurality of switch boxes. By way of example, stage S3 is illustrated as containing 3 switch boxes (labeled 0-2), each having 4 input terminals (labeled 0-3), that are connected to the output terminals 0, 1, and 10 from the switch boxes 0-3 in stage S2. The switch boxes 0-2 in stage S3 each additionally includes a number of input terminals that are connected to a portion of the output terminals from stage S2A in the feedback network switch 600, shown in FIG. 7. By way of example, switch boxes 520 and 540 may each have four input terminals that are connected to output terminals from stage S2A, while switch box 530 may have three input terminals that are connected to output terminals from stage S2A. Additionally, each switch box 520, 530, and 540 in stage S3 include an input terminal that is connected to an output terminal from a clock network switch 800, shown in FIG. 10. For example, as illustrated in FIG. 6, switch box 520 includes an input terminal that receives input from output terminal 2 of the clock network switch 800, designated as 800_2, while switch boxes 530 and 540, respectively receive input from output terminals 3 and 4 of the clock network switch 800, designated as 800_3 and 800_4. The switch boxes 0-2 in stage S3 may have a number of output terminals, e.g., each switch box 0-2 in stage S3 has 4 output terminals (labeled 0-3), where terminal 3 of switch box 1 in stage S3 may not be used. Alternatively, terminal 3 of switch box 1 may be omitted, but the presence of unused inputs/outputs may be advantageous as it provides more flexibility in usage capabilities. The output terminals from stage S3 are connected directly to the logic island 400, e.g., at the input terminals with matching terminal labels illustrated in FIG. 3, which are the input terminals that are not connected to the LUTs.

Figure 9:
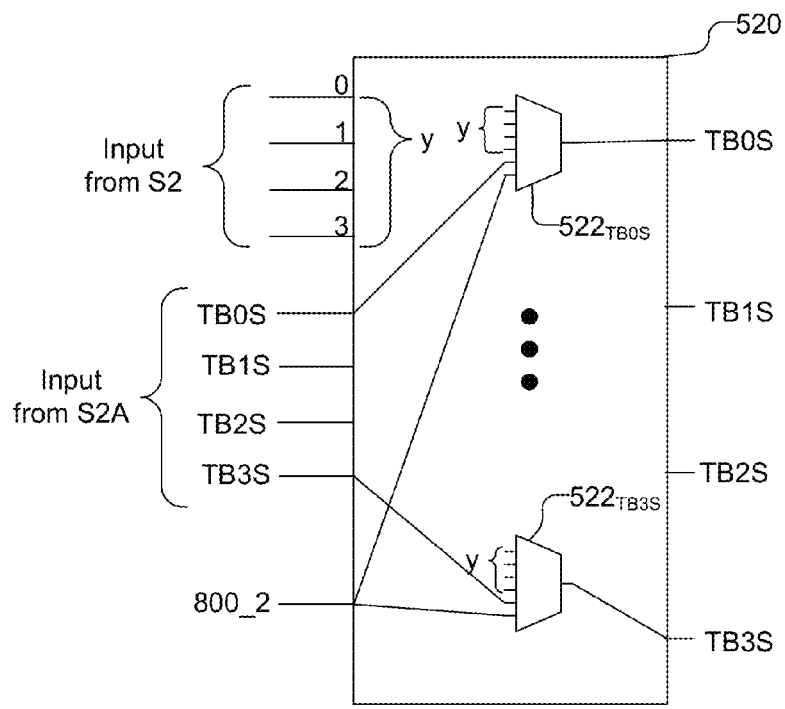
FIG. 9 illustrates a switch box from the third stage of the street network switch.

FIG. 9, by way of example, illustrates switch box 520 from stage S3. The remaining switch boxes in stage S3 may be similarly configured as illustrated by switch box 520. As illustrated in FIG. 9 switch box 520 receives input from S2 via 4 input terminals (labeled 0-3), collectively designated with a "y". Additionally, switch box 520 may also receive input from S2A at 4 input terminals, labeled TB0S, TB1S, TB2S, and TB3S, which are connected to a portion of the output terminals of the second stage of the feedback network switch S2A with corresponding terminal labels, shown in FIG. 7. The switch box 520 may further receive input from the clock network switch 800 from output terminal 2 of the clock network switch 800, designated as 800_2. Switch box 520 includes 4 output terminals TB0S, TB1S, TB2S, and TB3S, each of which has access to all of the input terminals 0-3 via 6×1 multiplexors via input terminals labeled with a "y." The 6×1 multiplexors further receive input from at least one of the signals from Input from S2A as well as the clock signal via terminal 800_2. Thus, for example, output terminal TB0S has access to all of the input terminals 0-3, as well as input terminal with the same label TB0S and the clock signal via terminal 800_2 via 6×1 multiplexor $522_{TB0S}$. Similarly, output terminals TB3S has access to all of the input terminals 0-3, as well as input terminal with the same respective labels TB3S and the clock signal via terminal 800_2 via 6×1 multiplexor $522_{TB3S}$. The remaining output terminals may have similar access to the input terminals. It should be understood that while 6×1 multiplexors are illustrated in switch box 520, other equivalent circuits may be used, for example, the 6×1 multiplexor may be replaced with a 4×1 multiplexor and a 3×1 multiplexor.

FIG. 7 illustrates the architecture of the feedback network switch 600, which includes two stages, S1A and S2A. As illustrated, each stage of the feedback network switch 600 may contain a plurality of switch boxes. For example, stage S1A may contain three switch boxes, labeled 0-2. The switch boxes in stage S1A may have a different number of input terminals. For example, switch boxes 610 and 620 of stage S1A each have 8 input terminals, while switch box 630 of stage S1A has 12 input terminals. For example, as illustrated in FIG. 7, the switch boxes 0-2 of stage S1A are connected to receive 12 output signals from the associated logic island 400, e.g., outputs T0Z, . . . , T3Z, CQ0z, . . . , CQ3Z, B0Z, . . . , B3Z as illustrated in FIG. 3. The switch boxes 0-2 of stage S1A are also connected to receive 4 output signals from logic islands in each of the immediately neighboring logic blocks, e.g., outputs CQxZ (x=0, . . . , 3) from each of the 4 neighboring logic blocks to the right (R), to the left (L), to the top (T) and to the bottom (B). If desired, the switch boxes 0-2 of stage S1A may also be connected to receive 4 output signals from logic islands in immediately neighboring logic blocks in the diagonal directions.

At least one switch box in stage S1A of the feedback network switch 600 includes at least one output terminal that does not have full access to all of the input terminals in that switch box. As illustrated in FIG. 7, each switch box 0-2 in stage S1A may have the same number of output terminals, illustrated as output terminals labeled 0-3. In stage S1A, the output terminals may not have full access to all of the input terminals in a switch box. In other words, in each switch box 0-2 in stage S1A, each output terminal 0-3 has access to less than all of the input terminals. By way of example, as illustrated by multiplexor 612 in switch box 610, each output terminal 0-3 has access to a proper subset of the input terminals 0-7. Multiplexor 612 is illustrated as a 6×1 multiplexor and, accordingly, each output terminal has access to 6 out of the 8 input terminals in switch boxes 610 and 620. Additionally, as illustrated in switch box 630, multiplexor 632 is illustrated as a 6×1 multiplexor and accordingly, each output terminal of switch box 630 has access to 6 out of the 12 input terminals labeled 0-11. If desired, each output terminal 0-3 in each switch box in stage S1A may have access to a different subset of input terminals. The specific input terminal that may be accessed by each output terminal may be programmed at time of initiation of the programmable logic device.

The second stage S2A of the feedback network switch 600 also includes a plurality of switch boxes. By way of example, stage S2A is illustrated as contains 4 switch boxes (labeled 0-3), each having 5 input terminals (labeled 0-4). A portion of the input terminals in each switch box in the second stage S2A is connected to the output terminals from switch boxes 0-2 in stage S1A. Additionally, each switch box in stage S2A includes two input terminals (3 and 4) that are connected to GND and VCC inputs. Each switch box in stage S2A includes 11 output terminals, where output terminal 1 of switch box 670 may not be used or may be omitted. Each output terminal has full access to the input terminals 0-3 of the switch box, while only selective output terminals may have access to VCC, e.g., via appropriately sized multiplexors. As discussed above, a portion of the output terminals from each switch box in stage S2A is provided to the second stage S2 of the street network switch 500 and the remaining portion of the output terminals from each switch box in stage S2A is provided to the third stage S3 of the street network switch 500.

Figure 10:
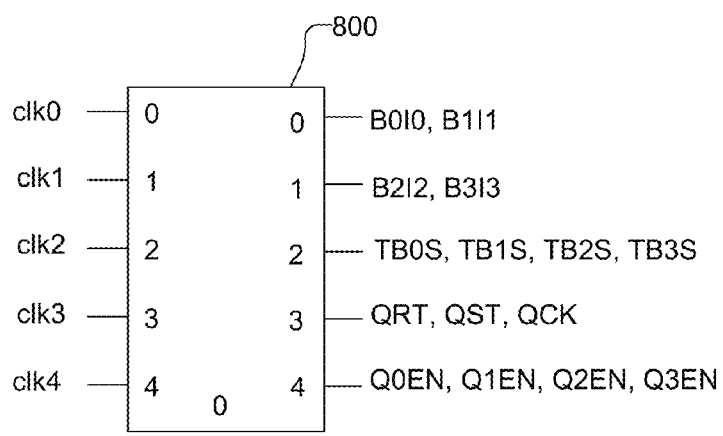
FIG. 10 illustrates a clock network switch.

FIG. 10 illustrates a clock network switch 800 that permits distribution of dedicated clock signals and/or high fan out signals to different inputs to the logic island. As illustrated, the clock network switch 800 may include 5 input terminals (labeled 0-4), which receive clock signals (clk0, clk1, clk2, clk3, and clk4). The clock network switch 800 further includes 5 output terminals labeled 0-4. Of course a different number of clock inputs or outputs may be used if desired. Each output terminal has full access to the input terminals of the clock network switch, e.g., via a 5×1 multiplexor. By providing clock signals to stage S2 and S3 in the street network switch 500, which may be provided directly to input terminals of the logic island 400, the logic island 400 has access to dedicated clock signals, timing critical signals, or high fan out signals with better timing.

Figure 11:
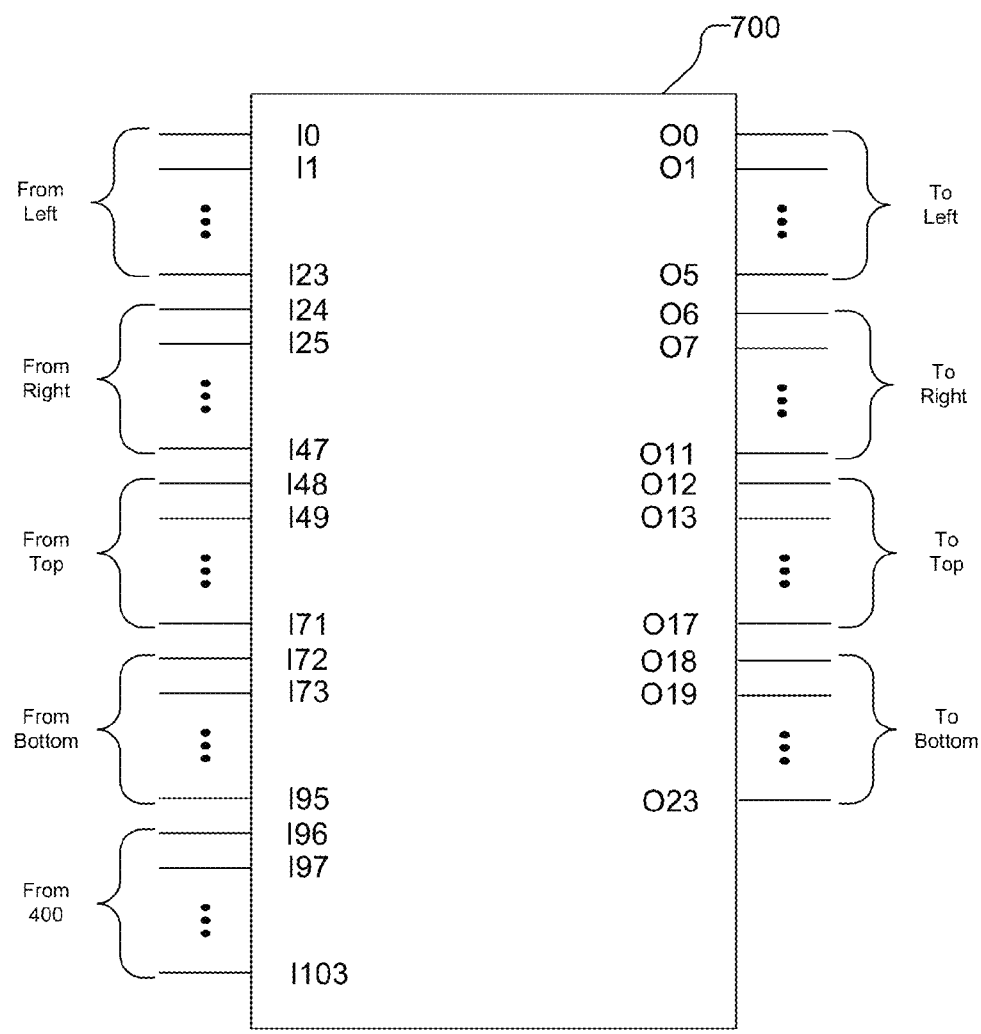
FIG. 11 illustrates the architecture of the highway network switch.
Figure 12:
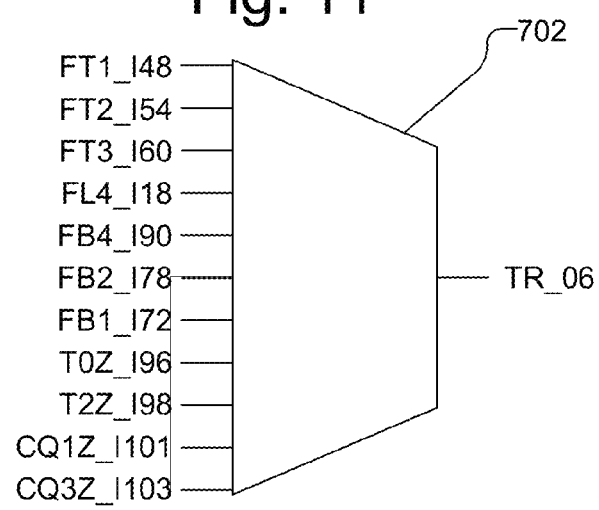
FIG. 12 illustrates a multiplexor that may be used in the highway network switch.

FIGS. 11 and 12 illustrate in combination, the architecture of the highway network switch 700. As illustrated in FIG. 11, the highway network switch 700 may be a single stage switch and may receive input signals from the highway network switches associated with a plurality of neighboring logic blocks to the left, right, top and bottom of the highway network switch 700, as well as diagonal directions if desired. For example, the highway network switch 700 may receive six input signals from four highway network switches, for a total of 24 inputs from the left (I0-I23), from the right (I24-I47), from the top (I48-I71), and from the bottom (I72-I95). The highway network switch 700 may additionally receive input signals from the associated logic island 400, e.g., two input signals (TZ and CQZ), from each of four logic cells of associated logic island 400 for a total of 8 input signals (I96-I103). The highway network switch may produce six output signals in each direction, e.g., to the left (O0-O5), to the right (O6-O11), to the top (O12-O17) and to the bottom (O18-O23) for a total of 24 outputs, as well as signals in the diagonal directions if desired. In each direction, six M×1 multiplexors are used, where out of the M inputs to each multiplexor, "p" inputs come from the neighboring highway network switches and q inputs are from the associated logic island 400. FIG. 12, by way of example, illustrates an example of an 11×1 multiplexor 702, e.g., where M=11, that may be used in the highway network switch 700. In this non-limiting example, p=7, i.e., 7 inputs are from neighboring highway network switches, and q=4, wherein 4 inputs are from the associated logic island 400. In this example, the multiplexors receives 11 inputs consisting of three signals (FTY_IXX) from the top, three from the bottom (FBY_IXX), one from the left (FLY_IXX) and four from the associated logic island 400 (TiZ_XXX, CQiZ_XXX), and produces one output (TR_OX), where Y indicates the distance from the highway network switch 700, X refers to the serial number of input pins of the highway network switch 700, i represents the index of the logic cell in a super logic cell, FT denotes "From Top," FL denotes "From Left," FB denotes "From Bottom," and TR denotes "To Right." For example, FB2_I78 indicates the signal is coming from two units away from the bottom of the highway network switch 700 and this signal is fed into I78 input pin/terminal of the highway network switch 700. Similarly, TR_O6 means the signal is going to the right of the highway network switch 700 and this signal can be realized on the output pin/terminal O6 of the highway network switch 700.

By way of example, the highway network switch 700 may be similar to a Wilton switch structure, where some neighboring signals come from the immediate four neighbors and can take turn (i.e., change of direction) and one comes from the 4th neighbor that goes through without changing any direction. For routing fixed length wire segments are used, where the length is four units. In other words, a wire that originates from a highway network switch may travel to another highway network switch that is four highway network switches away, without turning. However, in order to provide the flexibility to connect the nearer highway network switches, the tapping from the wire at each unit length, i.e., at each highway network switch, is possible. Accordingly, signals may travel quickly to the most distant highway network switch as well reach a nearer highway network switch without creating substantial routing congestion.

Although the present invention is illustrated in connection with specific embodiments for instructional purposes, the present invention is not limited thereto. Various adaptations and modifications may be made without departing from the scope of the invention. For example, the number of specific input terminals, output terminals, and signals provided on each input terminal and output terminal may vary as desired. Moreover, while specific circuit elements, such as 7×1 multiplexors, are discussed, equivalent circuit elements, e.g., multiple multiplexors may be used. Therefore, the spirit and scope of the appended claims should not be limited to the foregoing description.

What is claimed is:

1. A programmable logic device comprising:
a plurality of logic blocks and an interconnecting network;
wherein each logic block in the plurality of logic blocks comprises a logic island and a routing network associated with the logic island, wherein the routing network comprises:
a first stage comprising a first plurality of switch boxes; and
a second stage comprising a second plurality of switch boxes, wherein the first plurality of switch boxes of the first stage is interconnected with the second plurality of switch boxes of the second stage;
wherein at least one switch box in the first stage has a first number of input terminals and a second number of output terminals, at least one of the output terminals has access to less than all of the input terminals.

2. The programmable logic device of claim 1, wherein the at least one of the output terminals of the at least one switch box has access to half of the first number of input terminals.

3. The programmable logic device of claim 1, wherein a first set of output terminals of the at least one switch box has access to first subset of input terminals, and a second set of output terminals of the at least one switch box has access to a second subset of input terminals that is different than the first subset of input terminals.

4. The programmable logic device of claim 3, wherein the second subset of input terminals is a complement of the first subset of input terminals.

5. The programmable logic device of claim 1, wherein each of the output terminals of the at least one switch box has access to a different subset of input terminals.

6. The programmable logic device of claim 1, wherein the routing network comprises:
a feedback network comprising a feedback network switch, the feedback network switch receiving a first set of output signals from the logic island and producing feedback output signals; and
a street network comprising a street network switch, the street network switch receiving the feedback output signals and producing street output signals that are received by the logic island.

7. The programmable logic device of claim 6, wherein the at least one switch box in the first stage is in the feedback network switch.

8. The programmable logic device of claim 7, wherein the feedback network switch comprises the first plurality of switch boxes in the first stage, wherein each switch box in the plurality of switch boxes in the first stage of the feedback network switch has output terminals having access to less than all of input terminals.

9. The programmable logic device of claim 6, wherein the at least one switch box in the first stage is in the street network switch.

10. The programmable logic device of claim 9, wherein the street network switch comprises the first plurality of switch boxes in the first stage, wherein each switch box in the plurality of switch boxes in the first stage of the street network switch has output terminals having access to less than all of input terminals.

11. The programmable logic device of claim 6, wherein the feedback network switch of the logic block further receives a second set of output signals, a third set of output signals, a fourth set of output signals, and a fifth set of output signals from neighboring logic blocks.

12. The programmable logic device of claim 11, wherein the neighboring logic blocks comprise a first logic block, a second logic block, a third logic block, and a fourth logic block that are nearest to a top, bottom, right, and left of the logic block.

13. The programmable logic device of claim 12, wherein the feedback network switch further receives a sixth set of output signals, a seventh set of output signals, an eighth set of output signals, and a ninth set of output signals from neighboring logic blocks that are nearest to a top-left, top-right, bottom-left, and bottom-right of the logic block.

14. The programmable logic device of claim 6, wherein the street network switch further receives clock signals.

15. The programmable logic device of claim 6, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

16. The programmable logic device of claim 15, wherein the neighboring highway networks comprise a first set of highway networks, a second set of highway networks, a third set of highway networks, and a fourth set of highway networks to a top, bottom, right, and left of the logic block.

17. The programmable logic device of claim 16, wherein the highway network switch of the logic block further receives a fifth set of input signals, a sixth set of input signals, a seventh set of input signals, and an eighth set of input signals from neighboring highway networks that are nearest to a top-left, top-right, bottom-left, and bottom-right of the logic block.

18. The programmable logic device of claim 15, wherein the street network switch further receives the first set of input signals, the second set of input signals, the third set of input signals, and the fourth set of input signals from the neighboring highway networks.

19. A programmable logic device comprising:
a plurality of logic blocks and an interconnecting network; wherein each logic block in the plurality of logic blocks comprises a logic island and a routing network associated with the logic island, wherein the routing network comprises:
a network switch comprising a first stage of switch boxes, a second stage of switch boxes, and a third stage of switch boxes, wherein a first portion of output terminals of the second stage of switch boxes is connected directly to the logic island, and a remaining portion of output terminals of the second stage of switch boxes is connected directly to input terminals of the third stage of switch boxes.

20. The programmable logic device of claim 19, wherein the logic island comprises a plurality of look-up tables, a plurality of multiplexors and a register, wherein the first portion of output terminals of the second stage of switch boxes is connected to the input terminals of the plurality of look-up tables.

21. The programmable logic device of claim 20, wherein output terminals of the third stage of switch boxes are connected to remaining input terminals of the logic island.

22. The programmable logic device of claim 19, wherein the network switch further receives clock signals, wherein the clock signals are provided to the logic island through at least one of the second stage and the third stage of switch boxes.

23. The programmable logic device of claim 19, wherein the routing network further comprises:
a feedback network comprising a feedback network switch, the feedback network switch receiving a first set of output signals from the logic island and producing feedback output signals, wherein the feedback output signals are received by at least one of the second stage and the third stage of switch boxes of the network switch.

24. The programmable logic device of claim 23, wherein the feedback network switch of the logic block further receives a second set of output signals, a third set of output signals, a fourth set of output signals, and a fifth set of output signals from neighboring logic blocks.

25. The programmable logic device of claim 24, wherein the neighboring logic blocks comprise a first logic block, a second logic block, a third logic block, and a fourth logic block that are nearest to a top, bottom, right, and left of the logic block.

26. The programmable logic device of claim 25, wherein the feedback network switch further receives a sixth set of output signals, a seventh set of output signals, an eighth set of output signals, and a ninth set of output signals from neighboring logic blocks that are nearest to a top-left, top-right, bottom-left, and bottom-right of the logic block.

27. The programmable logic device of claim 23, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

28. The programmable logic device of claim 27, wherein the neighboring highway networks comprise a first set of highway networks, a second set of highway networks, a third set of highway networks, and a fourth set of highway networks to a top, bottom, right, and left of the logic block.

29. The programmable logic device of claim 28, wherein the highway network switch of the logic block further receives a fifth set of input signals, a sixth set of input signals, a seventh set of input signals, and an eighth set of input signals from neighboring highway networks that are nearest to a top-left, top-right, bottom-left, and bottom-right of the logic block.

30. The programmable logic device of claim 27, wherein the network switch further receives the first set of input signals, the second set of input signals, the third set of input signals, and the fourth set of input signals from the neighboring highway networks.

31. A programmable logic device comprising:
a plurality of logic blocks and an interconnecting network;
wherein each logic block in the plurality of logic blocks comprises a logic island and a routing network associated with the logic island, wherein the routing network comprises:
a feedback network comprising a feedback network switch, the feedback network switch receiving a first set of output signals from the logic island and producing feedback output signals; and
a street network comprising a street network switch, the street network switch comprising a first stage of switch boxes, a second stage of switch boxes connected to the first stage of switch boxes, and a third stage of switch boxes connected to the second stage of switch boxes, wherein at least one of the second stage of switch boxes and the third stage of switch boxes having input terminals that are coupled directly to the feedback network switch to receive the feedback output signals, the street network switch producing street output signals that are received by the logic island.

32. The programmable logic device of claim 31, wherein the feedback output signals are received by both the second stage of switch boxes and the third stage of switch boxes in the street network switch.

33. The programmable logic device of claim 31, wherein a first portion of output terminals of the second stage of switch boxes in the street network switch is connected directly to the logic island, and a remaining portion of output terminals of the second stage of switch boxes is connected directly to input terminals of the third stage of switch boxes in the street network switch.

34. The programmable logic device of claim 33, wherein the logic island comprises a plurality of look-up tables, a plurality of multiplexors and a register, wherein the first portion of output terminals of the second stage of switch boxes is connected to the input terminals of the plurality of look-up tables.

35. The programmable logic device of claim 34, wherein the output terminals of the third stage of switch boxes in the street network switch are connected to remaining input terminals of the logic island.

36. The programmable logic device of claim 33, wherein the street network switch further receives clock signals, wherein the clock signals are provided to the logic island through at least one of the second stage of switch boxes and the third stage of switch boxes.

37. The programmable logic device of claim 31, wherein the feedback network switch of the logic block further receives a second set of output signals, a third set of output signals, a fourth set of output signals, and a fifth set of output signals from neighboring logic blocks.

38. The programmable logic device of claim 37, wherein the neighboring logic blocks comprise a first logic block, a second logic block, a third logic block, and a fourth logic block that are the nearest to a top, bottom, right, and left of the logic block.

39. The programmable logic device of claim 38, wherein the feedback network switch further receives a sixth set of output signals, a seventh set of output signals, an eighth set of output signals, and a ninth set of output signals from neighboring logic blocks that are nearest to a top-left, top-right, bottom-left, and bottom-right of the logic block.

40. The programmable logic device of claim 31, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

41. The programmable logic device of claim 40, wherein the neighboring highway networks comprise a first set of highway networks, a second set of highway networks, a third set of highway networks, and a fourth set of highway networks to a top, bottom, right, and left of the logic block.

42. The programmable logic device of claim 41, wherein the highway network switch of the logic block further receives a fifth set of input signals, a sixth set of input signals, a seventh set of input signals, and an eighth set of input signals from neighboring highway networks that are nearest to a top-left, top-right, bottom-left, and bottom-right of the logic block.

43. The programmable logic device of claim 40, wherein the first stage of switch boxes of the street network switch is coupled to receive the first set of input signals, the second set of input signals, the third set of input signals, and the fourth set of input signals from the neighboring highway networks.

44. The programmable logic device of claim 31, wherein the feedback network switch receives GND and VCC and provides GND and VCC to the input terminals of the second stage of switch boxes that are coupled directly to the feedback network switch.

45. A programmable logic device comprising:
a plurality of logic blocks and an interconnecting network;
wherein each logic block in the plurality of logic blocks comprises a logic island and a routing network associated with the logic island, wherein the routing network comprises:
a clock network switch having a plurality of output terminals that carry clock signals; and
a street network comprising a street network switch, the street network switch comprising a first stage of switch boxes, a second stage of switch boxes connected to the first stage of switch boxes, and a third stage of switch boxes connected to the second stage of switch boxes, wherein at least a portion of the plurality of the output terminals of the clock network switch are coupled to provide the clock signals to at least one of the second stage of switch boxes and the third stage of switch boxes, the street network switch producing street output signals that are received by the logic island.

46. The programmable logic device of claim 45, wherein a first portion of the plurality of the output terminals of the clock network switch are coupled to provide a first portion of the clock signals to the second stage of switch boxes and a second portion of the plurality of the output terminals of the clock network switch are coupled to provide a second portion of the clock signals to the third stage of switch boxes.

47. The programmable logic device of claim 45, wherein a first portion of output terminals of the second stage of switch boxes in the street network switch is connected directly to the logic island, and a remaining portion of output terminals of the second stage of switch boxes is connected directly to input terminals of the third stage of switch boxes in the street network switch.

48. The programmable logic device of claim 47, wherein the logic island comprises a plurality of look-up tables, a plurality of multiplexors and a register, wherein the first portion of output terminals of the second stage of switch boxes is connected to the input terminals of the plurality of look-up tables.

49. The programmable logic device of claim 48, wherein output terminals of the third stage of switch boxes in the street network switch are connected to remaining input terminals of the logic island.

50. The programmable logic device of claim 45, wherein the routing network further comprises a feedback network comprising a feedback network switch, the feedback network switch receiving a first set of output signals from the logic island and producing feedback output signals that are received by the street network switch.

51. The programmable logic device of claim 50, wherein the second stage of switch boxes have input terminals that are coupled directly to the feedback network switch to receive the feedback output signals.

52. The programmable logic device of claim 50, wherein the third stage of switch boxes have input terminals that are coupled directly to the feedback network switch to receive the feedback output signals.

53. The programmable logic device of claim 50, wherein the feedback network switch of the logic block further receives a second set of output signals, a third set of output signals, a fourth set of output signals, and a fifth set of output signals from neighboring logic blocks.

54. The programmable logic device of claim 53, wherein the neighboring logic blocks comprise a first logic block, a second logic block, a third logic block, and a fourth logic block that are the nearest to a top, bottom, right, and left of the logic block.

55. The programmable logic device of claim 54, wherein the feedback network switch further receives a sixth set of output signals, a seventh set of output signals, an eighth set of output signals, and a ninth set of output signals from neighboring logic blocks that are nearest to a top-left, top-right, bottom-left, and bottom-right of the logic block.

56. The programmable logic device of claim 50, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

57. The programmable logic device of claim 56, wherein the neighboring highway networks comprise a first set of highway networks, a second set of highway networks, a third set of highway networks, and a fourth set of highway networks to a top, bottom, right, and left of the logic block.

58. The programmable logic device of claim 57, wherein the highway network switch of the logic block further receives a fifth set of input signals, a sixth set of input signals, a seventh set of input signals, and an eighth set of input signals from neighboring highway networks that are nearest to a top-left, top-right, bottom-left, and bottom-right of the logic block.

59. The programmable logic device of claim 56, wherein the street network switch further receives the first set of input signals, the second set of input signals, the third set of input signals, and the fourth set of input signals from the neighboring highway networks.

60. A programmable logic device comprising:
a plurality of logic blocks and an interconnecting network;
wherein each logic block in the plurality of logic blocks comprises a logic island and a routing network associated with the logic island, wherein the routing network comprises:
a feedback network comprising a feedback network switch, the feedback network switch comprising a first stage of switch boxes and a second stage of switch boxes, each switch box in the first stage of switch boxes has a plurality of input terminals, wherein a first subset of the plurality of input terminals is coupled to the logic island, and a second subset of the plurality of input terminals is coupled to neighboring logic islands that are in neighboring logic blocks immediately adjacent to the logic block, the feedback network producing feedback output signals; and
a street network comprising a street network switch, the street network switch receiving the feedback output signals and producing street output signals that are received by the logic island.

61. The programmable logic device of claim 60, wherein each switch box in the first stage of switch boxes includes a plurality of output terminals, and wherein in each switch box in the first stage of switch boxes at least one output terminal of the plurality of output terminals has access to less than all of the plurality of input terminals.

62. The programmable logic device of claim 61, wherein different switch boxes in the first stage of switch boxes have a different number of input terminals.

63. The programmable logic device of claim 60, wherein the neighboring logic blocks comprise a first logic block, a second logic block, a third logic block, and a fourth logic block that are nearest to a top, bottom, right, and left of the logic block.

64. The programmable logic device of claim 63, wherein the neighboring logic blocks further comprise a fifth logic block, a sixth logic block, a seventh logic block, and an eighth logic block that are nearest to a top-left, top-right, bottom-left, and bottom-right of the logic block.

65. The programmable logic device of claim 60, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

66. The programmable logic device of claim 65, wherein the neighboring highway networks comprise a first set of highway networks, a second set of highway networks, a third set of highway networks, and a fourth set of highway networks to a top, bottom, right, and left of the logic block.

67. The programmable logic device of claim 66, wherein the neighboring highway networks further comprise a fifth set highway networks, a sixth set of highway networks, a seventh set of highway networks, and an eighth set of highway networks to a top-left, top-right, bottom-left, and bottom-right of the logic block.

68. The programmable logic device of claim 65, wherein the street network switch is coupled to receive the first set of input signals, the second set of input signals, the third set of input signals, and the fourth set of input signals from the neighboring highway networks.

69. A programmable logic device comprising:
a plurality of logic blocks and an interconnecting network;
wherein each logic block in the plurality of logic blocks comprises a logic island and a routing network associated with the logic island, wherein the routing network comprises:
a feedback network comprising a feedback network switch, the feedback network switch receiving a first set of output signals from the logic island and receives GND and VCC, the feedback network switch producing feedback output signals including GND and VCC; and
a street network comprising a street network switch, the street network switch receiving the feedback output signals including GND and VCC and producing street output signals that are received by the logic island.

70. The programmable logic device of claim 69, wherein the street network switch comprises a first stage of switch boxes, a second stage of switch boxes connected to the first stage of switch boxes, and a third stage of switch boxes connected to the second stage of switch boxes, the second stage of switch boxes having input terminals that are coupled directly to the feedback network switch to receive the feedback output signals.

71. The programmable logic device of claim 69, wherein the routing network further comprises:
a highway network comprising a highway network switch, the highway network switch receiving a second set of output signals from the logic island, and receiving a first set of input signals, a second set of input signals, a third set of input signals and a fourth set of input signals from neighboring highway networks, the highway network switch providing a first set of output signals, a second set of output signals, a third set of output signals and a fourth set of output signals to the neighboring highway networks.

72. The programmable logic device of claim 71, wherein the neighboring highway networks comprise a first set of highway networks, a second set of highway networks, a third set of highway networks, and a fourth set of highway networks to a top, bottom, right, and left of the logic block.

73. The programmable logic device of claim 72, wherein the neighboring highway networks further comprise a fifth set highway networks, a sixth set of highway networks, a seventh set of highway networks, and an eighth set of highway networks to a top-left, top-right, bottom-left, and bottom-right of the logic block.

74. The programmable logic device of claim 71, wherein the street network switch is coupled to receive the first set of input signals, the second set of input signals, the third set of input signals, and the fourth set of input signals from the neighboring highway networks.

\* \* \* \* \*